United States Patent
Bury et al.

(10) Patent No.: US 10,143,102 B2
(45) Date of Patent: Nov. 27, 2018

(54) FUNCTION COMPONENT UPPER PART FOR A COMPONENT CONSTRUCTION SYSTEM

(71) Applicant: Phoenix Contact GmbH & Co. KG, Blomberg (DE)

(72) Inventors: Joachim Bury, Herford (DE); Thomas Salomon, Verl (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 15/033,685

(22) PCT Filed: Nov. 3, 2014

(86) PCT No.: PCT/EP2014/073549
§ 371 (c)(1),
(2) Date: May 2, 2016

(87) PCT Pub. No.: WO2015/063292
PCT Pub. Date: May 7, 2015

(65) Prior Publication Data
US 2016/0286674 A1    Sep. 29, 2016

(30) Foreign Application Priority Data
Nov. 4, 2013 (DE) .......................... 10 2013 112 110

(51) Int. Cl.
*H05K 7/00* (2006.01)
*H05K 7/02* (2006.01)
(Continued)

(52) U.S. Cl.
CPC ........... *H05K 7/026* (2013.01); *H01R 9/2425* (2013.01); *H01R 12/714* (2013.01); *H05K 7/10* (2013.01);
(Continued)

(58) Field of Classification Search
CPC ...... H02G 15/06; H02G 15/076; H02G 3/088; H02G 3/16; H02G 3/10; H02G 3/12;
(Continued)

(56) References Cited

U.S. PATENT DOCUMENTS 3,264,526 A * 8/1966 Wiggerman ............. H05K 7/02
361/715
4,158,757 A * 6/1979 Reichert .................. H01H 9/04
174/564
(Continued)

FOREIGN PATENT DOCUMENTS

DE       1933645 A1    1/1970
DE       1933945 A1    1/1970
(Continued)

OTHER PUBLICATIONS

International search report, "PCT Application No. PCT/EP2014/073549", dated Mar. 11, 2015.

*Primary Examiner* — Pete T Lee
(74) *Attorney, Agent, or Firm* — Arash Behravesh; Mannava & Kang, P.C.

(57) ABSTRACT

The invention concerns a function component upper part (500) for placing on a function component lower part (401) of a function component (400), having a first interface for electrically connecting the function component lower part (401) of the function component (400), and a second interface for electrically 409 connecting a housing upper part (403) of the function component (400).

14 Claims, 5 Drawing Sheets

(51) Int. Cl.
  *H05K 7/14* (2006.01)
  *H01R 9/24* (2006.01)
  *H01R 12/71* (2011.01)
  *H05K 7/10* (2006.01)

(52) U.S. Cl.
  CPC ......... *H05K 7/1441* (2013.01); *H05K 7/1477* (2013.01); *H05K 7/1478* (2013.01)

(58) Field of Classification Search
  CPC ........ H02G 3/0616; H02G 3/083; H02G 3/18; H02G 3/22; H02G 3/24; B60R 16/0222; H05K 7/026; H05K 7/1441; H05K 7/1477; H05K 7/1478; H05K 7/10; H01R 9/2425; H01R 12/714
  See application file for complete search history.

(56) References Cited

U.S. PATENT DOCUMENTS

| | | | | |
|---|---|---|---|---|
| 5,309,315 A | * | 5/1994 | Naedel | H05K 7/1427 174/386 |
| 5,352,850 A | * | 10/1994 | Norris | H02G 3/16 174/51 |
| 5,645,434 A | * | 7/1997 | Leung | H01R 31/005 439/74 |
| 6,081,048 A | * | 6/2000 | Bergmann | H05K 7/1472 307/147 |
| 7,184,272 B1 | * | 2/2007 | Harlacher | H05K 7/023 361/728 |
| 9,320,182 B2 | * | 4/2016 | Steger | H05K 7/20927 |
| 2002/0048994 A1 | * | 4/2002 | Oota | H01R 9/24 439/98 |
| 2002/0125799 A1 | * | 9/2002 | Landsberger | A47B 47/0091 312/209 |
| 2005/0186857 A1 | | 8/2005 | Sichner et al. | |
| 2005/0248925 A1 | | 11/2005 | Cane et al. | |
| 2006/0086521 A1 | * | 4/2006 | Andresen | H02G 3/086 174/50 |
| 2006/0136622 A1 | | 6/2006 | Rouvelin et al. | |
| 2011/0011641 A1 | | 1/2011 | Pfeffer | |

FOREIGN PATENT DOCUMENTS

| | | |
|---|---|---|
| DE | 29607525 U1 | 6/1996 |
| DE | 19616516 C1 | 7/1997 |
| DE | 20302844 U1 | 7/2004 |
| EP | 1079465 A2 | 2/2001 |
| JP | 2002372152 A | 12/2002 |
| WO | 02/23676 A1 | 3/2002 |

* cited by examiner

FUNCTION COMPONENT UPPER PART FOR A COMPONENT CONSTRUCTION SYSTEM

PRIORITY

The present application claims priority under 35 U.S.C. § 371 to PCT Application PCT/EP2014/073549 filed on Nov. 3, 2014, which claims priority to German Patent Application No. 10 2013 112 110.1, filed on Nov. 4, 2013, the disclosures of which are hereby incorporated by reference in their entireties.

TECHNICAL FIELD

The present invention relates to a function component upper part for placing on a function component lower part of a function component of a fieldbus system.

BACKGROUND

Modern component construction systems in automation technology typically consist of a large number of function components that are arranged in a switch cabinet. The distribution functions for energy and data are realized with separate plug-in systems. A construction that does not use a switch cabinet is not possible, since peripheral devices close to the switch cabinet are attached through an energy distribution system configured in a star shape. If fieldbus concepts are used in which individual components are placed on rear panels, large weights act on the rear panels. Housings for electrical devices are usually made in one or two parts. A combination with further housings is achieved through wiring or through interfaces in an extension direction.

The object on which the invention is based is to provide a function component upper part for a fieldbus system that can be extended to any desired extent in at least two dimensions.

This object is achieved by the subject matter having the features according to the independent claim. Advantageous embodiments of the invention are the subject matter of the figures, the description and of the dependent claims.

According to one aspect of the invention, the object is through a function component upper part for placing on a function component lower part of a function component of a component construction system with a housing; a mechanical interface formed in the housing for mechanical connection to the function component lower part; and socket receptacles for accepting the plug of the function component lower part which are arranged on a lower face of the housing of the function component upper part. The socket receptacles can be protruding.

The interface can, moreover, be electromechanical.

The function component can be a function component of a component construction system that can be a fieldbus system.

In an advantageous embodiment of the function component upper part, the mechanical interface comprises screwed connections located at the corners of the housing.

In a further advantageous embodiment of the function component upper part, the housing comprises a surrounding sealing contour for a sealing element, in order to seal the function component upper part against the function component lower part or against the housing upper part.

In a further advantageous embodiment of the function component upper part, the housing comprises a side opening for the insertion of an electrical cable.

In a further advantageous embodiment of the function component upper part, the housing comprises at least one hexagonal recess and/or a cylindrical recess for the insertion of a segment of the sealing element.

In a further advantageous embodiment of the function component upper part, the housing comprises, on one side, a hexagonal recess for the insertion of a hexagonal segment of the sealing element and, on an opposite side, a cylindrical recess for the insertion of a cylindrical segment of the sealing element.

In a further advantageous embodiment of the function component upper part, the housing comprises an internal thread for a cable gland.

In a further advantageous embodiment of the function component upper part, the function component upper part comprises a connecting apparatus, in particular a connecting terminal block for the connection of an inserted electrical cable.

In a further advantageous embodiment of the function component upper part, the connecting apparatus comprises at least one mantle terminal.

In a further advantageous embodiment of the function component upper part, the function component upper part comprises a cover with a closable opening.

In a further advantageous embodiment of the function component upper part, the function component upper part or the cover comprises cooling fins for the dissipation of heat.

In a further advantageous embodiment of the function component upper part, the function component upper part is made of a metal material, of plastic, or of composite materials.

In a further advantageous embodiment of the function component upper part, the function component upper part comprises a switch for interrupting an electrical cable and/or a mains power supply unit and/or a frequency converter and/or a display.

In a further advantageous embodiment of the function component upper part, the function component upper part comprises a switch opening for a connection.

In a further advantageous embodiment of the function component upper part, the function component upper part comprises a connecting socket for the connection of an electrical cable.

In a further advantageous embodiment of the function component upper part, the function component upper part comprises a further mechanical interface on which a function upper part of a further function component can be placed. In this way the function upper part can be employed as an intermediate ring for vertical expansion with further function component upper parts.

The further function upper part can exhibit the features of the function upper part.

The further mechanical interface can be constructed like the mechanical interface, and can exhibit its features.

Further exemplary embodiments of the invention are illustrated in the drawings, and are described in detail below. Here:

BRIEF DESCRIPTION OF THE DRAWINGS

FIG. 1 shows an exploded view of a fieldbus system 100. The fieldbus system 100 is, according to one embodiment, assembled from a housing assembly kit that can be plugged together, in which the components are latched onto a supporting profile rail 200. The construction concept of the fieldbus system 100 comprises a supporting profile rail 200 as an assembly platform, bridge modules 300 and function components 400, each of which consists of a function component lower part 401 as a lower connecting part and a housing upper part 403 as a function upper part. A sealing element 405 is arranged between the function component lower part 401 and the housing upper part 403, in order to prevent the ingress of moisture. The sealing element 405 is fastened to the function component lower part 401 by means of screws 407. The housing upper part 403 is also screwed by means of screws 409 to the function component lower part 401.

Figure 1:
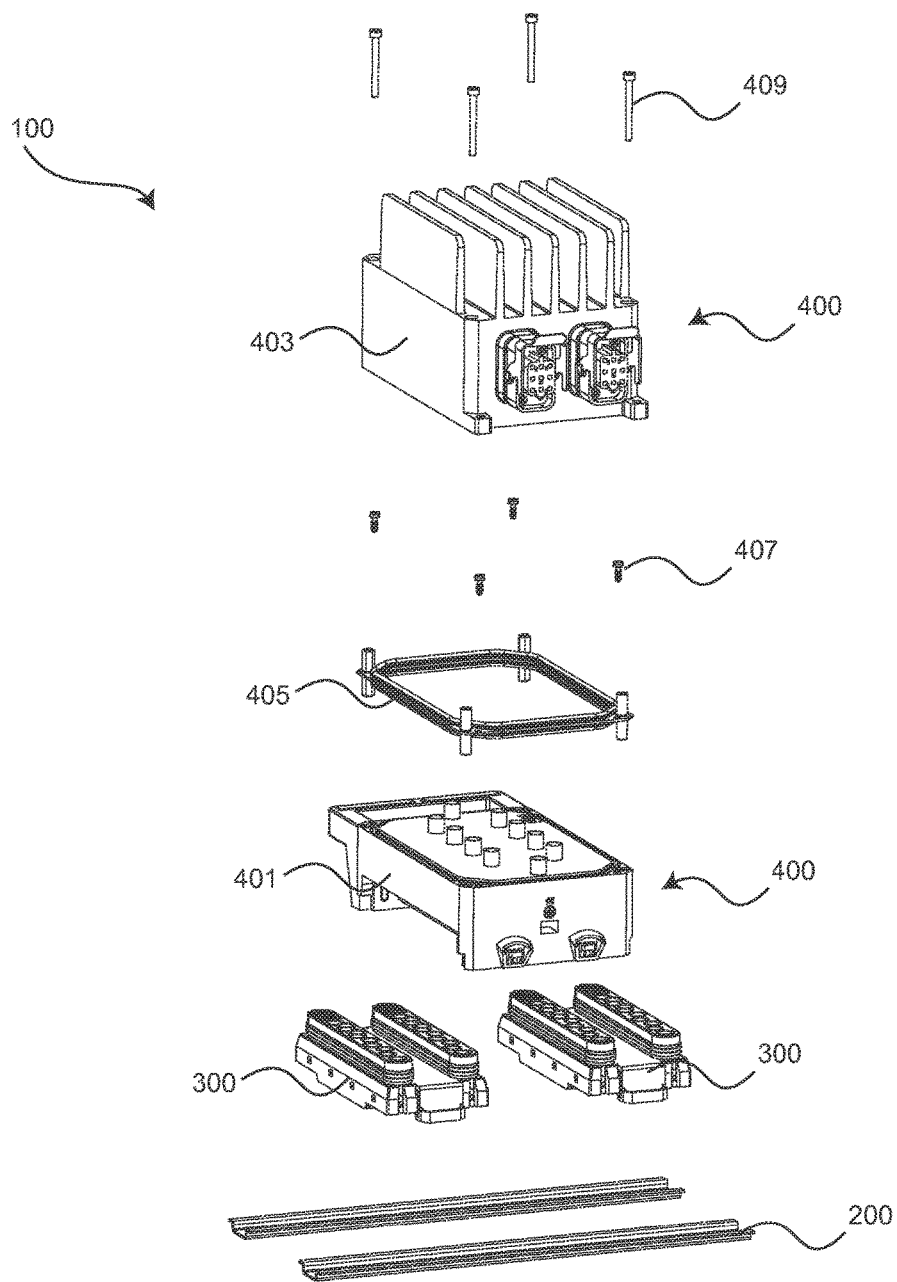
FIG. 1 shows an exploded view of a fieldbus system.

Different embodiments of the construction concept can be realized according to the intended purpose. The construction concept can be extended indefinitely. The internal electrical connections for energy distribution of, for example, 400 V or 24 V, and the data bus are realized simultaneously with the plugging together of the components. The connecting functions are realized in a function component lower part 401 of the function components 400 and the bridge modules 300 with the bridge connectors 305. The functions of supply, protection and switching are given by the sequence of the arrangement of the function components 400. The user functions such as, for example, supply, protection or switching are implemented in the housing upper part 403 which is connected through plug-in contacts to the function component lower part 401.

DETAILED DESCRIPTION

The housing upper part 403 as a function module has a defined mechanical interface, and optionally an electrical interface, to the function component lower part 401, and can also be used with other function component lower parts 401 with the same interface. The function component lower part 401 contains the connecting equipment. The housing upper part 403 contains, for example, the functions of disconnecting, protecting or switching. The direction of the effect of the said functions is achieved, depending on the housing upper part 403 and the function component lower part 401, in the line and/or in the consumer outlet, i.e. a plug-in connection in the housing upper part 403. The connecting equipment can be interrupted in the function component lower part 401.

The supporting profile rail 200 constitutes a one-piece support system with a wide rail for a rack construction which reproduces the geometry of the supporting edges of the bridge module 300 and of the function components 400. Alternatively, two different standard supporting profile rails can be used as a two-piece support system, having for example a width of 35 mm for a wall-mounted construction. The supporting profile can be formed of a top-hat profile.

The bridge module 300 is the key connecting element in the housing construction concept of the fieldbus system 100, which both performs the electrical connections between the function components 400 and forms, together with the supporting profile rail 200, the connection to the classic construction technology. In general, the bridge module 300 can be formed as a floating bearing that is only latched onto on the supporting profile rail 200 and is movable on it, or as a fixed bearing with a metal clamping fixture and PE contacts.

Figure 2:
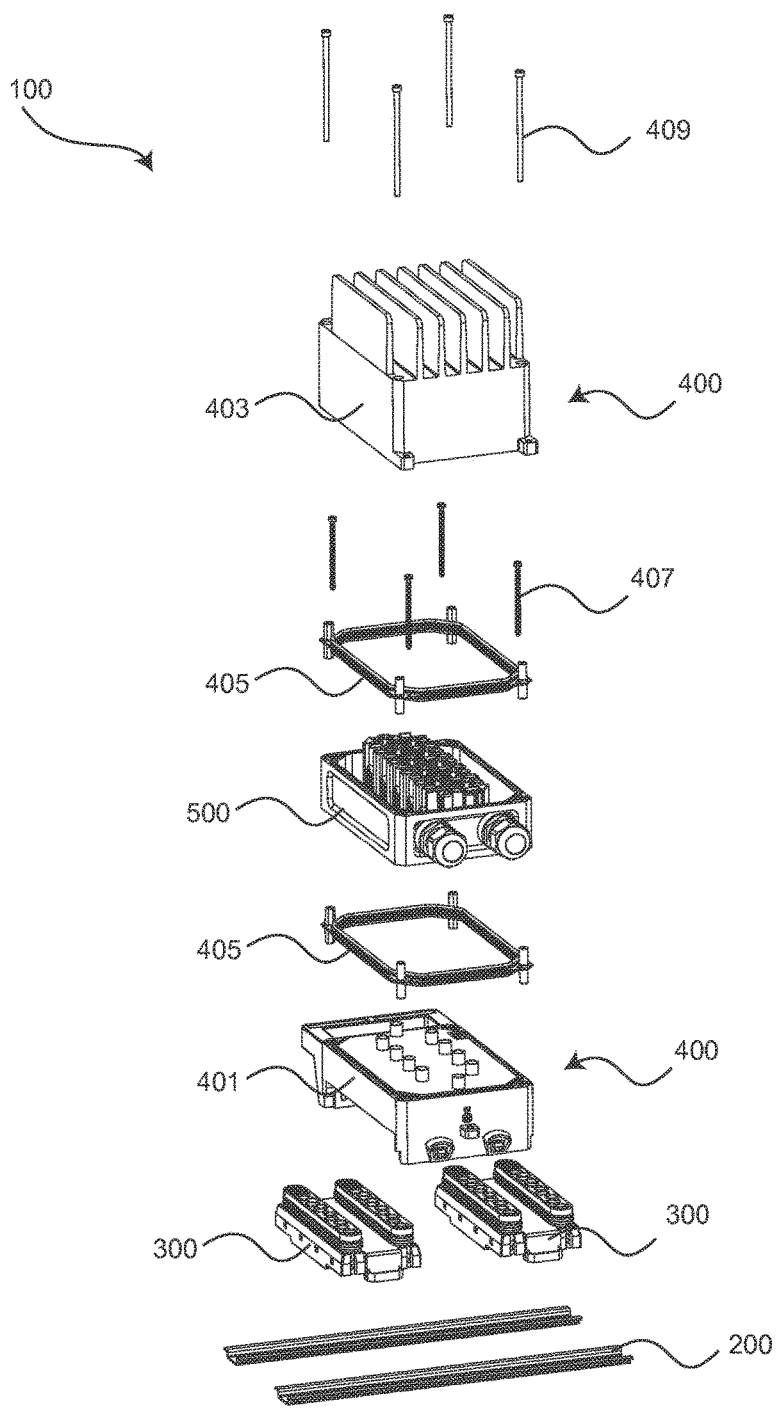
FIG. 2 shows an exploded view of a fieldbus system with a function component upper part.

FIG. 2 shows an exploded view of a fieldbus system 100 with a function component upper part 500. The function module 403 with a mains device function is placed with a sealing element 405 on the function component upper part 500, and is thus electrically and mechanically fastened. The function component upper part 500 is placed on the function component lower part 401, and offers a distribution function.

The function component upper part 500 is arranged between the housing upper part 403 and the function component lower part 401. A housing center part is formed as an intermediate ring with electrical connection unit by the function component upper part 500. In this way, the same mechanical and electrical interfaces can be stacked upwards and downwards. When expanding or adding to the fieldbus system, only a single jointing direction exists for all combinations, and only one electrical connecting unit for a wired connection or a plug-in solution.

Figure 3:
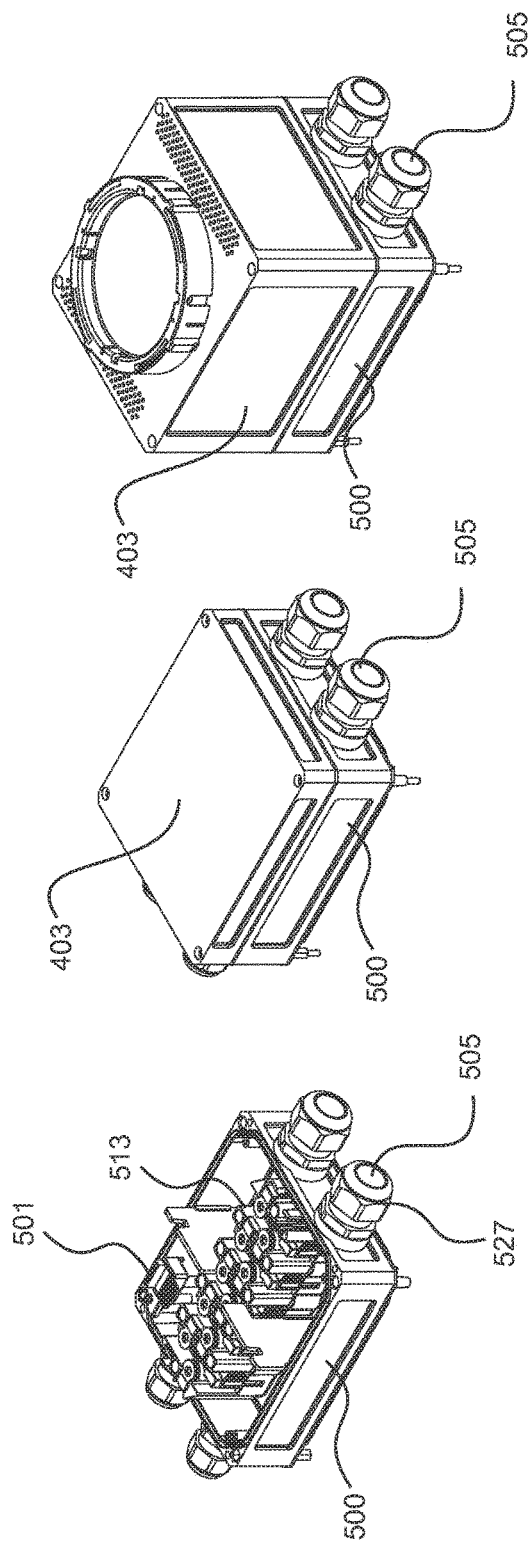
FIG. 3 shows a plurality of views of the function component upper part on which a housing upper part is placed.

FIG. 3 shows a plurality of views of the function component upper part 500 with the housing upper part 403 of the function component 400 placed on it. The function component upper part 5001 comprises a housing 501 that surrounds a connecting apparatus 513 to the side, and which is open on the upper and lower sides. An opening 505 with a sealing screw 527 is arranged in the side wall of the housing 501, in order to be able to feed in a cable from the outside to the connecting apparatus 513. Different modular housing upper parts 403 can be placed on the function component upper part 500, such as for example a housing upper part 403 with a mains device function or a cover function.

Figure 4:
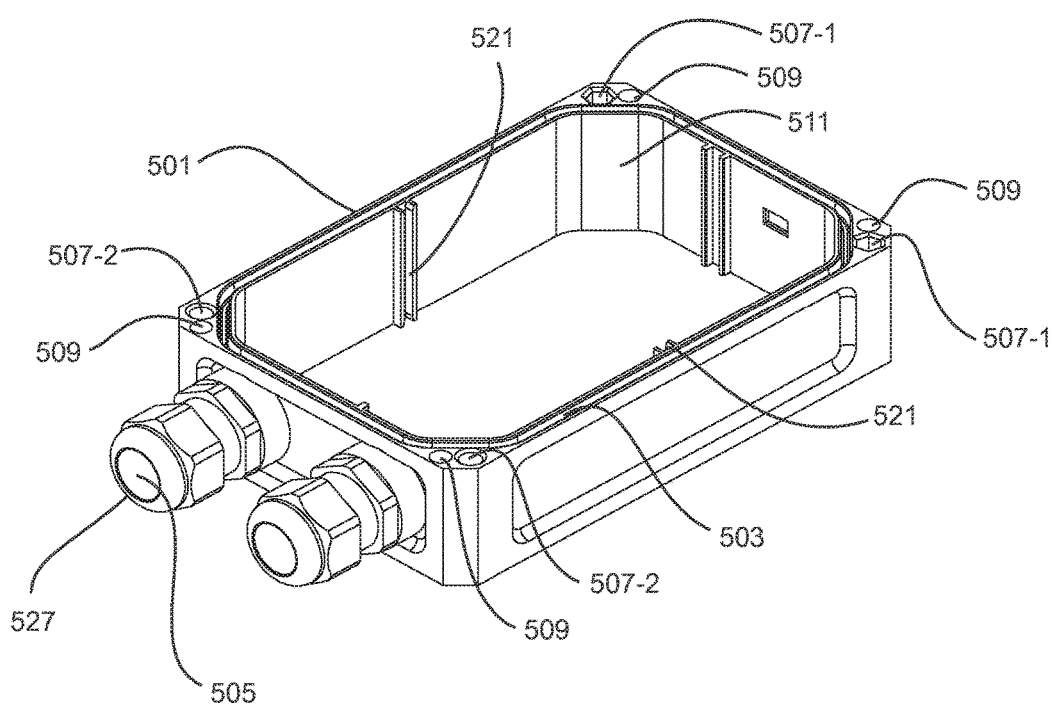
FIG. 4 shows a view of a housing of the function component upper part.

FIG. 4 shows a view of a housing 501 of the function component upper part 500. The housing 501 comprises a surrounding recess 503 for the insertion of a sealing element 405 in order to seal the function component upper part 500 against the function component lower part 401 or against the housing upper part 403. The surrounding recess 503 thus forms a sealing contour groove for the sealing element 405. There are two side openings 505 each with a sealing screw 527 for the insertion of a cable 515 are formed in the side wall of the housing 501.

On the upper face and the lower face of the housing 501 there are, in each case, two hexagonal recesses 507-1 and two cylindrical recesses 507-2 for the insertion of a corresponding segment of the sealing element 405. Guidance and coding is achieved when the housing parts are brought together in the correct position through the hexagonal recesses 507-1 on both sides and the two cylindrical recesses 507-2, which act as guide bushes inside the housing 501. The housing 501 comprises a corner region 511 with a greater wall thickness than in the side region of the housing 501, and is diagonally reinforced by the corner region 511. The respective hexagonal recesses 507-1 or cylindrical recesses 507-2 are additionally formed in the diagonally reinforced corner region 511. The housing 501 also comprises, in the respective corner region 511, an internal thread 509 for screwing on the sealing element 405 by means of a screw.

Two guide grooves 521 are provided opposite one another on the inner face of the housing 501 to guide a support plate or separating wall. The insertable support plate for supporting the connecting device 513 on the housing 501. In this case the function component upper part 500 comprises an insertable separating wall.

Figure 5:
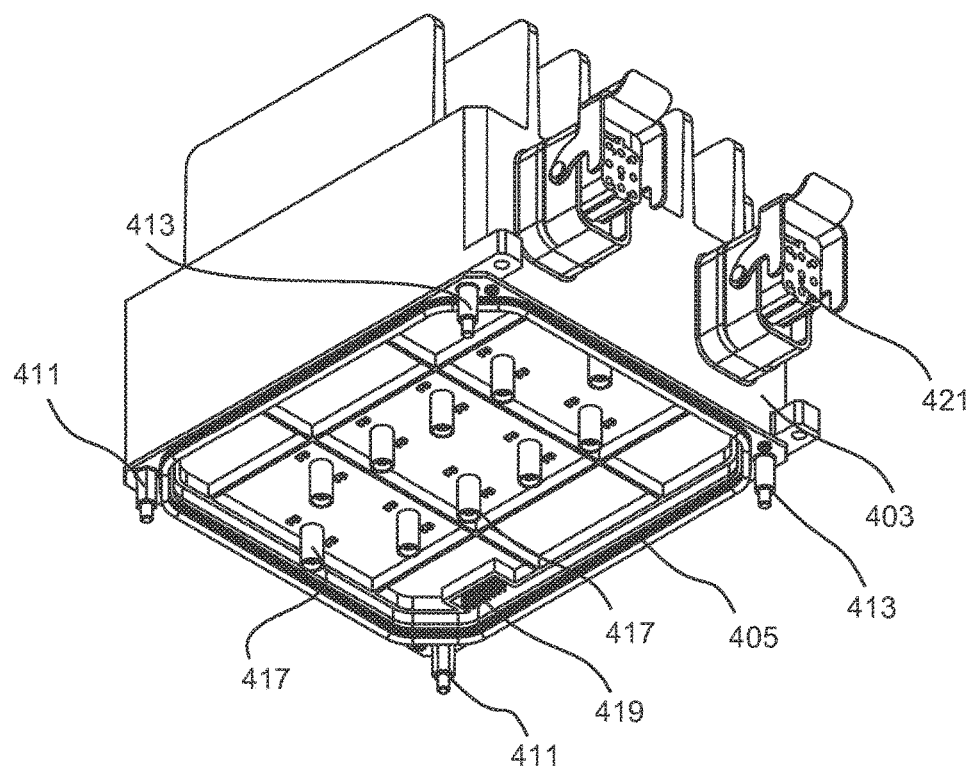
FIG. 5 shows a view of a function component upper part.

FIG. 5 shows a view of the function component upper part 403. Plug-in contacts 417 as an interface for establishing a connection with the function component upper part 500 are located on the lower face of the function component upper part 403. In addition, the lower face of the function component upper part 403 comprises a data bus interface 419 which is connected to the function component upper part 500 when the function component upper part 403 is placed on. In addition, the sealing element 405 with the hexagonal segments 411 and the cylindrical segments 413 that are inserted into the respective hexagonal recesses 507-1 and cylindrical recess 507-2, is placed on the lower face of the function component upper part 403. Further plug-in contacts 421 for the connection of cables are arranged on the side at the function component upper part 403.

In addition, the function component upper part 403 can comprise one or more closable openings for the connection of a cable, hatches, switch openings for connections, plug-in sockets, switches or cooling fins. The housing of the function component upper part 500 can consist of a metal material, of plastic or of composite material.

In particular, the function component upper part 403 can, in addition to the interface to a function component lower part arranged underneath it, also comprise a second mechanical or electromechanical interface to a further function component upper part 403 arranged above it. In this case, the function component upper part 403 can be used as an intermediate part or an intermediate ring for vertical expansion. In this case the housing 501 can take the form of a frame.

Through the use of a simple feed, the field stations can be used as end devices of a classical star-configuration distribution, or, through the use of a connection and distribution module they can become participants or nodes of an energy distribution network. Switching and protection units, motor switches, bus couplers or I/O units etc. can be arranged freely in a sequence determined by function to the left and right of the connection and distribution module. In this way, engineering advantages accrue through a visible separation of low-voltage and medium-voltage components. Several field stations can be distributed as participants across a network with any desired structure, such as for example a line, tree or ring.

A central switch cabinet within the designed power range of the energy distribution system is no longer required. Through a suitable implementation of the data bus that is also carried, the sequence and the positions of individual components of the field stations can be checked for arrangement in accordance with planning prior to commissioning (Remote Putting into Service, Remote Service).

The fieldbus system 100 permits a construction of "smart" installation networks for direct current and alternating current, and for distribution without switch cabinets in suitable plant layouts. The fieldbus system can be used in the installation or in the energy distribution application fields. In the case of a distributed automation system, a construction of modular field stations as function nodes in "smart" installation networks is possible. In alternative switch cabinet concepts, a construction of modular stations is possible in the switch cabinet without power rails and without control wiring and with identical project planning for IP20 . . . IP6x.

Through the fieldbus system 100, modular motor switches in the field can be developed with a high degree of protection. Through the fieldbus system 100, an integrated construction concept (Power & Drive, P&D) is also developed, which fulfills the object of an advantageous distribution and provision of energy in the field, for example outside a switch cabinet. The modularity of the fieldbus system 100 allows the application to be extended beyond the modular field station, to "smart" energy distribution and to an alternative switch cabinet construction. In addition, the spectrum of stand-alone function components as end devices in a classic star-configured energy distribution system can also be covered. The fieldbus system 100 permits a flexible construction of modular systems in the field (IP6x) and within or outside a switch cabinet on standard supporting profile rails (IP20). If preassembled, pre-wiring can be performed on an assembly frame.

The above-mentioned fieldbus system 100 realizes a housing toolkit that permits the necessary flexibility for a modular construction and thereby provides the foundation for a distributed installation system or a distributed automation system. Through the extension of the possibility for assembly on supporting rails, the construction concept can also be employed inside switch cabinets. As a result, a housing concept is achieved for function components such as, for example, mains units or motor switches with variable construction technology. In general, the fieldbus system 100 can be constructed for wall-mounting or supporting rail mounting with an electrical connection unit. The fieldbus system 100 comprises a variable connection technology for connection through the cables or through a plug-in system integrated into the housing.

All the features explained and illustrated in connection with individual embodiments of the invention can be provided in various combinations in the subject matter of the invention in order to realize their advantageous effects simultaneously.

The scope of protection of the present invention is given by the claims, and is not restricted by the features explained in the description or illustrated in the figures.

LIST OF REFERENCE SIGNS

100 Fieldbus system
200 Supporting profile rail
300 Bridge module
400 Function component
401 Function component lower part
403 Function component upper part
405 Sealing element
407 Screws
409 Screws
411 Hexagonal segment
413 Cylindrical segment
417 Plug-in contact
419 Data bus interface
421 Plug-in contact
500 Function component upper part
501 Housing
503 Recess
505 Side opening
507-1 Hexagonal recess
507-2 Cylindrical recess
509 Internal thread
511 Internal thread
513 Connecting apparatus
515 Cable
517 Mantle terminal
519 Supporting plate
521 Guide groove
523 Fastening tab
525 Recess
527 Sealing screw

The invention claimed is:

1. A function component upper part for placing onto a function component lower part of a function component of a component construction system comprising:
   a housing;

a mechanical interface formed in the housing for mechanical connection to the function component lower part; and socket receptacles to accept a plug of the function component lower part which is arranged at a lower side of the housing of the function component upper part, wherein the function component upper part comprises a connecting apparatus for the connection of an inserted electrical cable;

wherein the housing comprises a surrounding recess for an insertion of a sealing element to seal the function component upper part against at least one of the function component lower part and against the housing upper part, wherein the housing comprises at least one recess for inserting a corresponding segment of the sealing element, such that guidance and coding is achieved when the housing parts are brought together in the correct position, and wherein the housing comprises an internal thread for screwing on the sealing element by means of a screw.

2. The function component upper part as claimed in claim 1, wherein the mechanical interface comprises screwed connections at the corners of the housing.

3. The function component upper part as claimed in claim 1, wherein the housing comprises a side opening for the insertion of an electrical cable.

4. The function component upper part as claimed in claim 1, wherein the housing comprises at least one of a hexagonal recess and a cylindrical recess for the insertion of a segment of the sealing element.

5. The function component upper part as claimed in claim 4, wherein the hexagonal recess is configured on one side for the insertion of a hexagonal segment of the sealing element, and the cylindrical recess is configured on an opposite side for the insertion of a cylindrical segment of the sealing element.

6. The function component upper part as claimed in claim 1, wherein the housing comprises an internal thread for a cable gland.

7. The function component upper part as claimed in claim 1, wherein the connecting apparatus comprises at least one mantle terminal.

8. The function component upper part as claimed in claim 1, wherein the function component upper part comprises a cover with a closable opening.

9. The function component upper part as claimed in claim 1, wherein the function component upper part comprises cooling fins for the dissipation of heat.

10. The function component upper part as claimed in claim 1, wherein the function component upper part is formed of at least one of a metal material, plastic, and a composite material.

11. The function component upper part as claimed in claim 1, wherein the function component upper part comprises a switch for interrupting at least one of an electrical line, a mains unit, a frequency converter, and a display.

12. The function component upper part as claimed in claim 1, wherein the function component upper part comprises a connecting socket for connecting at least one of an electrical cable and a switch opening for an electrical connection.

13. The function component upper part as claimed in claim 1, wherein the function component upper part comprises a further mechanical interface onto which a function upper part of a further function component is placed.

14. The function component upper part as claimed in claim 1, wherein the function component upper part comprises a connecting terminal block for the connection of an inserted electrical cable.

* * * * *